US010776556B2

United States Patent
Mikuni et al.

(10) Patent No.: US 10,776,556 B2
(45) Date of Patent: Sep. 15, 2020

(54) WIRING BOARD DESIGN SUPPORT APPARATUS, METHOD FOR WIRING BOARD VIA ARRANGEMENT AND STORAGE MEDIUM RECORDING PROGRAM FOR WIRING BOARD VIA ARRANGEMENT

(71) Applicant: KABUSHIKI KAISHA NIHON MICRONICS, Tokyo (JP)

(72) Inventors: Katsushi Mikuni, Tokyo (JP); Ryuichi Yagisawa, Tokyo (JP); Akitsugu Yamaguchi, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 16/454,441

(22) Filed: Jun. 27, 2019

(65) Prior Publication Data

US 2020/0050732 A1 Feb. 13, 2020

(30) Foreign Application Priority Data

Aug. 13, 2018 (JP) ................. 2018-152509

(51) Int. Cl.
*G06F 30/00* (2020.01)
*G06F 30/394* (2020.01)
*G01R 1/073* (2006.01)
*G01R 3/00* (2006.01)
*G06F 30/39* (2020.01)

(52) U.S. Cl.
CPC ....... *G06F 30/394* (2020.01); *G01R 1/07342* (2013.01); *G01R 3/00* (2013.01); *G01R 1/07307* (2013.01); *G06F 30/39* (2020.01)

(58) Field of Classification Search
CPC ... G06F 30/394; G06F 30/39; G01R 1/07342; G01R 1/07307; G01R 3/00
See application file for complete search history.

(56) References Cited

U.S. PATENT DOCUMENTS

| 6,510,539 B1 * | 1/2003 | Deemie | G06F 30/39 716/111 |
| 6,596,549 B2 * | 7/2003 | Kitamura | H01L 24/85 438/6 |
| 7,007,258 B2 * | 2/2006 | Li | G06F 30/39 716/122 |

(Continued)

FOREIGN PATENT DOCUMENTS

JP 2006-165591 A 6/2006

*Primary Examiner* — Naum Levin
(74) *Attorney, Agent, or Firm* — Bacon & Thomas, PLLC

(57) ABSTRACT

A wiring board design support apparatus, in which a plurality of vias are arranged on a wiring board, includes a design information storage unit that stores design information of vias and wirings to be arranged on the wiring board, and a wiring board via arrangement unit that moves, on a basis of the design information, positions of lattice points arranged with same intervals in vertical and horizontal directions by a given moving amount in a vertical direction and a horizontal direction while alternately changing a moving direction in the horizontal direction of the lattice points for each row of the lattice and alternately changing a moving direction in the vertical direction of the lattice points for each column of the lattice, so as to arrange vias at positions of the lattice points after movement.

6 Claims, 13 Drawing Sheets

(56) References Cited

U.S. PATENT DOCUMENTS

| | | | | |
|---|---|---|---|---|
| 7,051,434 B2* | 5/2006 | Miller | ............... | H01L 23/49838 |
| | | | | 174/255 |
| 7,266,794 B2* | 9/2007 | Yamazaki | ............... | G06F 30/23 |
| | | | | 716/115 |
| 7,269,813 B2* | 9/2007 | Brown | ............. | H01L 23/49827 |
| | | | | 257/773 |
| 7,323,787 B2* | 1/2008 | Chan | ................ | H01L 23/49816 |
| | | | | 257/738 |
| 7,340,711 B2* | 3/2008 | Hetzel | .................. | G06F 30/394 |
| | | | | 716/130 |
| 7,368,667 B2* | 5/2008 | Brown | ............. | H01L 23/49816 |
| | | | | 174/262 |
| 7,464,358 B1* | 12/2008 | Wadland | ............... | G06F 30/394 |
| | | | | 716/126 |
| 7,738,259 B2* | 6/2010 | Chan | ................... | H05K 1/0231 |
| | | | | 361/760 |
| 7,797,663 B2* | 9/2010 | Bird | ................... | G01R 31/2818 |
| | | | | 716/137 |
| 7,823,096 B2* | 10/2010 | Katagiri | ............... | G06F 30/367 |
| | | | | 716/136 |
| 8,286,124 B2* | 10/2012 | Sakata | ................. | G06F 30/367 |
| | | | | 716/137 |
| 8,341,586 B2* | 12/2012 | Frankle | ................ | G06F 30/394 |
| | | | | 716/126 |
| 8,575,954 B2* | 11/2013 | Chong | .................... | G01R 3/00 |
| | | | | 324/754.07 |
| 8,856,717 B2* | 10/2014 | Kumagai | ............. | G06F 30/394 |
| | | | | 716/126 |
| 9,627,306 B2* | 4/2017 | Grivna | ............. | H01L 23/49816 |
| 9,635,760 B1* | 4/2017 | Chan | ..................... | H05K 1/113 |
| 9,898,567 B2* | 2/2018 | Salodkar | ................ | G06F 30/39 |
| 2016/0224701 A1* | 8/2016 | Kim | ..................... | G06F 30/367 |

* cited by examiner

WIRING BOARD DESIGN SUPPORT APPARATUS, METHOD FOR WIRING BOARD VIA ARRANGEMENT AND STORAGE MEDIUM RECORDING PROGRAM FOR WIRING BOARD VIA ARRANGEMENT

CROSS-REFERENCE TO RELATED APPLICATIONS

The present application claims, under 35 USC 119, priority of Japanese Patent Application No. 2018-152509 filed on Aug. 13, 2018.

TECHNICAL FIELD

The present disclosure relates to a wiring board design support apparatus, a method for wiring board via arrangement, and a storage medium recording program for wiring board via arrangement. The present disclosure may be applied to a device that determines the arrangement of vias on a wiring board (multilayer wiring board) of a probe card testing a plurality of electronic circuits formed in a semiconductor wafer, for example.

BACKGROUND ART

Each semiconductor integrated circuit (electronic circuit) formed on a semiconductor wafer is subjected to electrical inspection using a tester device before being divided to chips. In this electrical inspection, a probe card is generally interposed between a tester device and semiconductors integrated circuit as a test object, and the probe card transmits inspection signals, response output, and the like between the tester device and the semiconductor integrated circuit.

To be more specific, the probe card has a circular plate form, and includes, at an upper surface periphery thereof, a tester interface part connected to the tester device.

The probe card includes a plurality of probes electrically connected to the tester interface part. Each probe is in contact with an electrode pad of each semiconductor integrated circuit, whereby the semiconductor integrated circuit is electrically connected to the tester through the probe.

Moreover, the probe card includes a wiring board, and a plurality of probes are arranged on one surface of the wiring board. The probes are connected to the tester interface part by a direct wiring path, or through an electronic part (e.g., a relay, a condenser, a resistor, a coil, etc.) provided on an upper surface of the wiring board. Therefore, as the wiring board of such a probe card, a multilayer wiring board is formed.

To achieve a number of wiring paths, a number of vias are arranged on a wiring board of each layer forming a multilayer wiring board. The vias are generally arranged in a latticed pattern with equal pitches in accordance with mounted parts and the like, and the wiring is housed between vias with equal pitch intervals (see FIG. 12).

For example, it is supposed that the via pad 2 is arranged in the conditions that a dimension of a via pad (diameter 2r here) is 0.5 mm, a wiring width w is 0.1 mm, and a pitch interval p of via pads is 0.8 mm, as illustrated in FIG. 13. In such a case, if it is necessary to secure a clearance of 0.05 mm or larger between a via pad and a wiring pattern, one wiring 3 is provided between the via pads 2-1 and 2-2.

Recently, with the narrower pitches between mounted parts, the pitch interval between via pads arranged on each wiring board has been also reduced, which makes it difficult to increase the number of wirings housed between via pads.

When the wiring is housed between via pads arranged in a latticed pattern with equal pitches, a slight clearance may be left in the pitch interval of the via pads, depending on design conditions of a wiring board. In such a case, to improve the wiring housing property, a designer adjusts the arrangement of via pads to increase the number of wirings.

Conventionally, Patent Literature 1 discloses, for example, the method of adjusting the arrangement of via pads. Patent Literature 1 discloses the technology which increases or reduces the pitch intervals in a vertical direction or horizontal direction between via pads in a block area.

Moreover, a designer also adjusts positions of via pads to arbitrary positions to improve the wiring housing property.

CITATION LIST

Patent Literature

Patent Literature 1: Japanese Patent Application Laid-open No. 2006-165591

SUMMARY

Technical Problem

However, the method in which a designer adjusts positions of via pads to arbitrary positions, as described above, is not preferable in work efficiency. Moreover, the change of positions of via pads expands a via arrangement area, which makes it difficult to arrange mounted parts with high density due to interference among via arrangement areas.

Furthermore, in the method of adjusting pitch intervals in the vertical direction or horizontal direction between via pads, as described in Patent Literature 1, a large area and a small area are mixed in the vertical direction or horizontal direction. This causes the deviation of the number of housed wirings and may cause an influence on other wiring layers.

Therefore, there have been demanded a wiring board design support apparatus, a method for wiring board via arrangement, and a storage medium recording program for wiring board via arrangement, which are capable of improving, with preferable work efficiency, the wiring housing property without deviation in a vertical direction or a horizontal direction, without expanding via arrangement areas.

Solution to Problem

To solve such a problem, a wiring board design support apparatus according to the first aspect of the present disclosure is a wiring board design support apparatus arranging a plurality of vias on a wiring board, including (1) a design information storage means that stores design information of vias and wirings to be arranged on the wiring board, and (2) a wiring board via arrangement means that moves, on a basis of the design information, positions of lattice points arranged with same intervals in vertical and horizontal directions by a given moving amount in a vertical direction and a horizontal direction while alternately changing a moving direction in the horizontal direction of the lattice points for each row of the lattice and alternately changing a moving direction in the vertical direction of the lattice points for each column of the lattice, so as to arrange vias at positions of the lattice points after movement.

A method for wiring board via arrangement according to the second aspect of the present disclosure is a wiring board design support method for arranging a plurality of vias on a wiring board, including (1) storing, by a design information storage means, design information of vias and wirings to be arranged on the wiring board, and (2) moving, by a wiring board via arrangement means, on a basis of design information, positions of lattice points arranged with same intervals in vertical and horizontal directions by a given moving amount in a vertical direction and a horizontal direction while alternately changing a moving direction in the horizontal direction of the lattice points for each row of the lattice and alternately changing a moving direction in the vertical direction of the lattice points for each column of the lattice, so as to arrange vias at positions of the lattice points after movement.

A storage medium recording program for wiring board via arrangement according to the third aspect of the present disclosure causes, with a wiring board design support program for arranging a plurality of vias on a wiring board, a computer including a design information storage means that stores design information of vias and wirings to be arranged on a wiring board to function as a wiring board via arrangement means that moves, on a basis of the design information, positions of lattice points arranged with same intervals in vertical and horizontal directions by a given moving amount in a vertical direction and a horizontal direction while alternately changing a moving direction in the horizontal direction of the lattice points for each row of the lattice and alternately changing a moving direction in the vertical direction of the lattice points for each column of the lattice, so as to arrange vias at positions of the lattice points after movement.

Advantageous Effects of Invention

The present disclosure improves, with preferable work efficiency, the wiring housing property without deviation in a vertical direction or a horizontal direction, without expanding via arrangement areas.

DESCRIPTION OF EMBODIMENTS (A) Main Embodiment

The following will describe in detail an embodiment of a wiring board design support apparatus, a method for wiring board via arrangement, and a storage medium recording program for wiring board via arrangement according to the present disclosure, with reference to the enclosed drawings.

(A-1) Configuration of Embodiment

Figure 2:
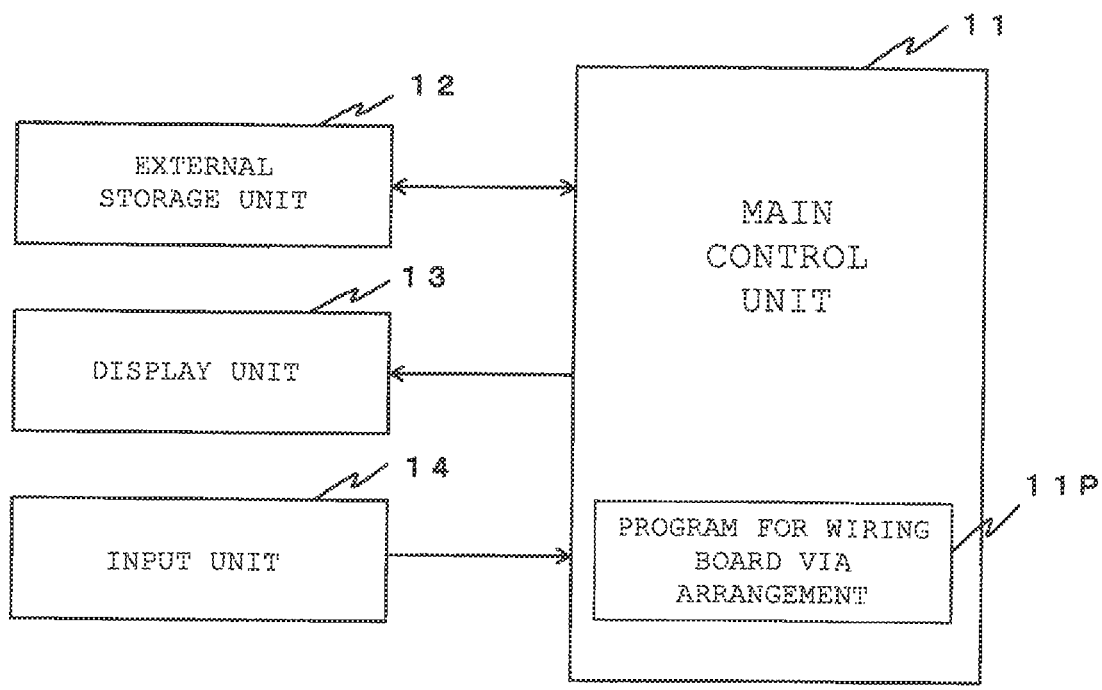
FIG. 2 is a configuration diagram illustrating a hardware configuration of a wiring board design support apparatus according to the embodiment.

FIG. 2 is a configuration diagram illustrating a hardware configuration of a wiring board design support apparatus according to the embodiment.

In FIG. 2, a wiring board design support apparatus 10 of the embodiment includes a main control unit 11, an external storage unit 12, a display unit 13, and an input unit 14.

As the hardware configuration of the wiring board design support apparatus 10 of the embodiment, there may be applied a general computer such as a personal computer, a dedicated computer-aided design (CAD) device for designing a wiring board, or the like, for example. Moreover, the program for wiring board via arrangement 11P of the embodiment may be installed to such a computer to achieve the functions as the wiring board design support apparatus 10. Regardless of which construction method is adopted, the hardware configuration is such as in FIG. 2, for example. The wiring board design support apparatus 10 may also include a printer, a communication unit, and the like connected to the main control unit 11, in addition to the components exemplified in FIG. 2.

The main control unit 11 includes a CPU, a main memory, a working memory, and the like, and executes the provided program for wiring board via arrangement 11P of the embodiment.

The external storage unit 12 includes a hard disk device, and a memory in the outside of the main control unit 11 such as a USB memory, and stores various kinds of data. The external storage unit 12 stores a board design CAD data 12A described later and a board design CAD via additional arrangement file 22B, for example.

The display unit 13 display-outputs guidance information, design image information, and the like to a designer. The input unit 14 includes a keyboard, a mouse, and the like, and takes in input information from a designer. That is, the display unit 13 and the input unit 14 form a man-machine interface with a designer.

Figure 3:
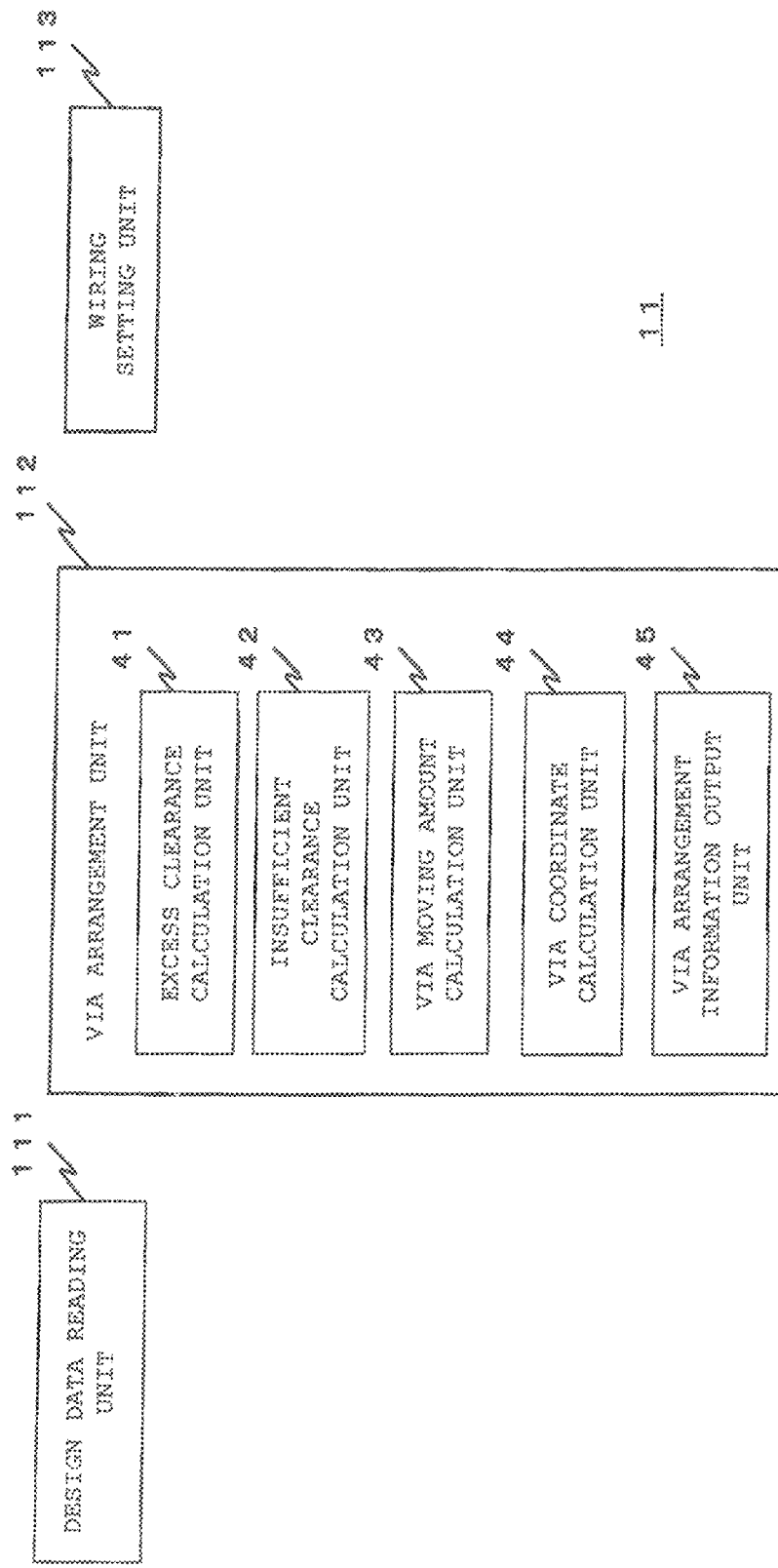
FIG. 3 is an explanatory diagram illustrating a function part (routine) configuration of a program for wiring board via arrangement 11P according to the embodiment.

FIG. 3 is an explanatory diagram illustrating a function part (routine) configuration of the program for wiring board via arrangement lip according to the embodiment. Note that all of or a part of the function parts illustrated in FIG. 3 may not be necessarily achieved by software, and may be achieved by hardware such as a dedicated chip.

In FIG. 3, the program for wiring board via arrangement 11P includes a design data reading unit 111, a via arrangement unit 112, and a wiring setting unit 113. Moreover, the via arrangement unit 112 includes an excess clearance calculation unit 41, an insufficient clearance calculation unit 42, a via moving amount calculation unit 43, a via coordinate calculation unit 44, and a via arrangement information output unit 45.

Note that the processing of components of the program for wiring board via arrangement 11P executed by the main control unit 11 will be described in detail in the section of operation.

(A-2) Operation of Embodiment

The following will describe the operation of wiring board via arrangement processing in the wiring board design support apparatus 10 of the embodiment, with reference to the enclosed drawings.

Figure 4:
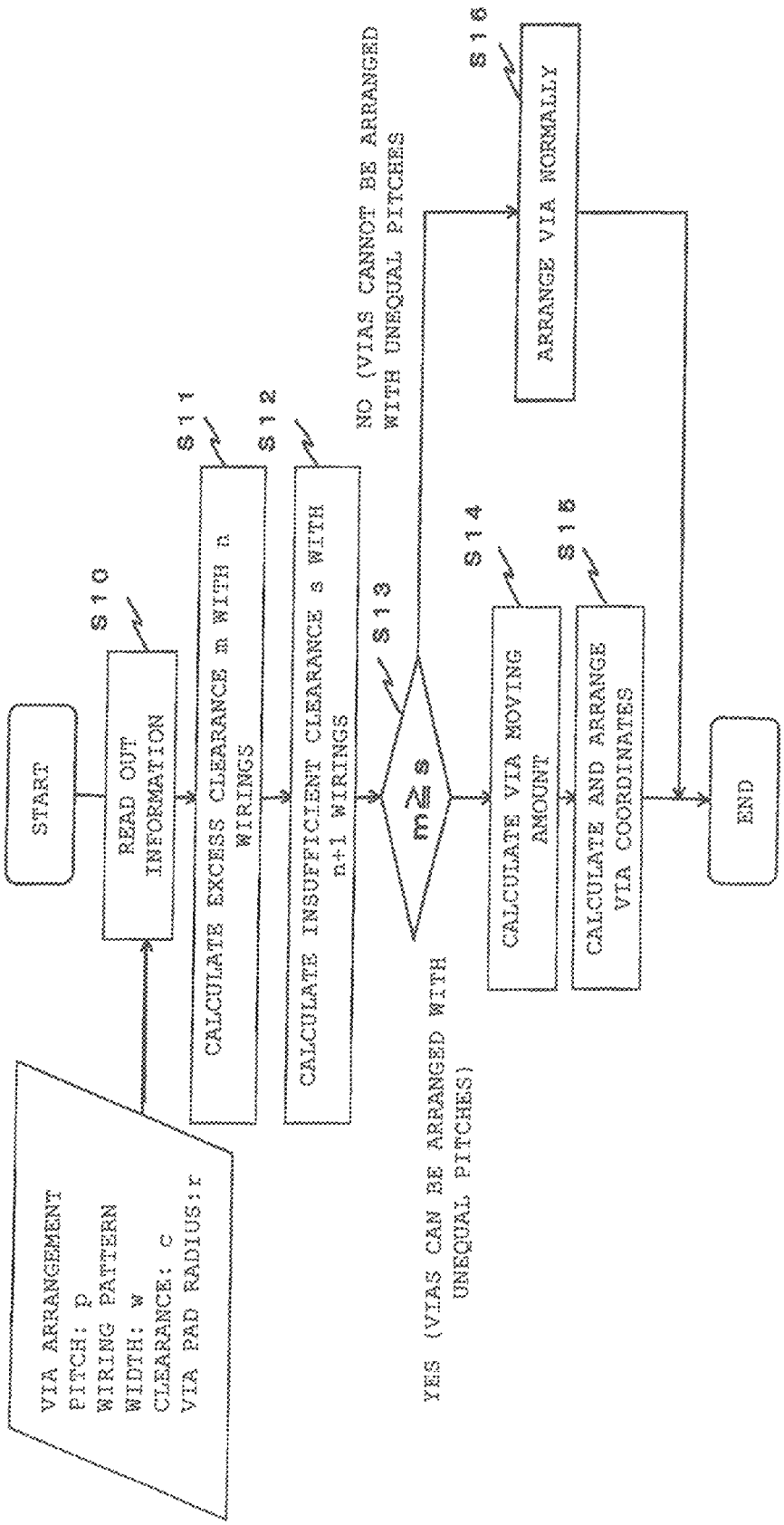
FIG. 4 is a flowchart illustrating a wiring board via arrangement processing according to the embodiment.

FIG. 4 is a flowchart illustrating a wiring board via arrangement processing according to the embodiment.

Once the method for wiring board via arrangement starts in the wiring board design support apparatus 10, the main control unit 11 reads out board design CAD data from the external storage unit 12 (S10).

Here, the board design CAD data read out by the main control unit 11 from the external storage unit 12 may be information necessary for the design of vias and wirings to be arranged on a wiring board. For example, the board design CAD data includes via pad dimension information (via pad radius; r in this embodiment), via pad pitch information (p), wiring pattern width information (w), clearance information (c), and coordinate information of each via (x, y). Note that the board design CAD data is not limited to the above-described various kinds of information, and may also include arrangement information of electronic parts to be provided on an upper surface of a wiring board, information of pads on a lower surface of a wiring board, and the like.

Figure 9:
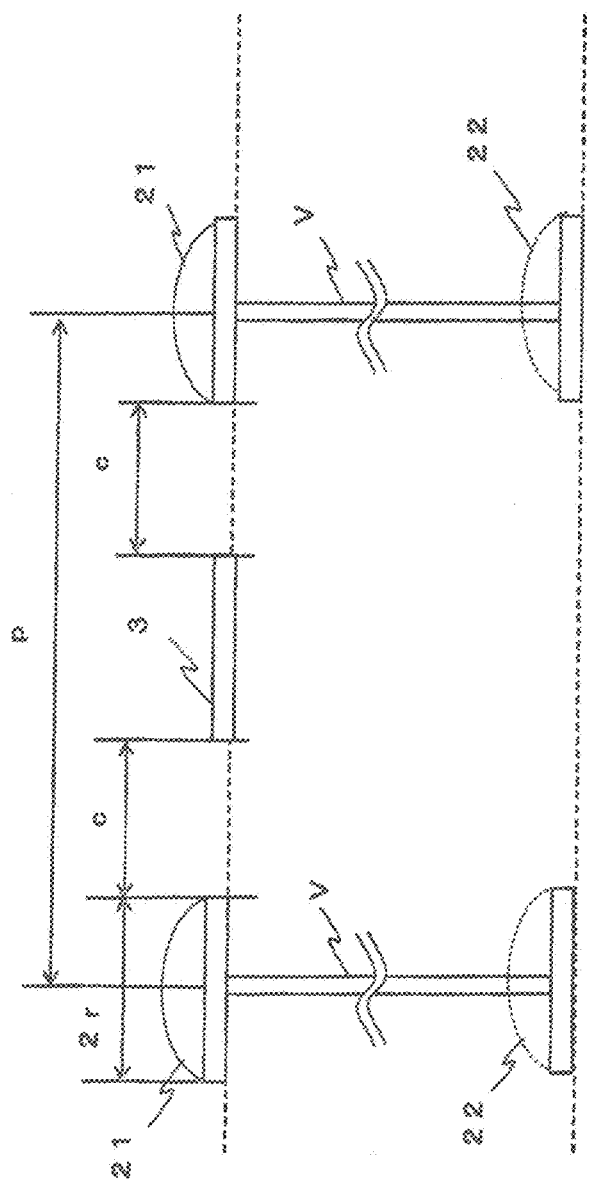
FIG. 9 is an explanatory diagram explaining via pads and clearances according to the embodiment.

The via pad dimension information indicates a dimension of a pad (via pad) to which arranged vias are connected. For example, FIG. 9 is a diagram exemplifying the relation between vias and a pad to which the vias are connected. FIG. 9 illustrates a case in which a via V is a through via, and the via V is connected to a hemisphere pad 21. In the case of this example, the via pad dimension information indicates dimension information of the pad 21 to which the via V is connected. Note that although the embodiment exemplifies the case in which the via pad dimension information is of a radius r of the pad 21, the via pad dimension information may be of a diameter of the pad 21. Moreover, the via pad dimension information may be information in accordance with the shape or the like of the pad 21 to which the via V is connected.

The via pad pitch information indicates a distance between vias arranged in a latticed pattern with equal pitches. To be more specific, the via pad pitch information indicates a distance of a straight line connecting center positions of via pads.

The wiring pattern width information indicates a wiring width.

The coordinate information of each via is coordinate information of each via arranged in a latticed pattern with equal pitches in the X direction and the Y direction, in an area on a wiring board. The wiring board of the probe card has a circular plate form, and allows expression in the XY coordinate system with a center of a circle as an origin, for example. A position of an intersection of a line in the X-direction and a line in the Y-direction in a latticed pattern formed with equal pitches may be coordinate information of each via.

The clearance information indicates a minimum distance necessary to be secured between a via pad and a wiring or between a wiring and a wiring. The embodiment exemplifies the case in which a clearance between a via pad and a wiring is equal to a clearance between a wiring and a wiring. However, a clearance between a via pad and a wiring may be different from a clearance between a wiring and a wiring.

As described above, the above-described board design CAD data is predetermined before the operation of determining via arrangement is started, and the main control unit 11 can read out the above-described board design CAD data from the external storage unit 12.

Once the main control unit 11 reads out the board design CAD data, the main control unit 11 calculates, on the basis of the read board design CAD data, a value of an excess clearance m in a case where the number of wirings is n (S11), and further calculates a value of an insufficient clearance s in a case where the number of wirings is (n+1) (S12).

[Calculation Method of Excess Clearance m]

Here, the calculation method of an excess clearance m with n wirings will be described with reference to FIG. 5 and FIG. 6.

The main control unit 11 obtains, as board design CAD data, a radius r of each via pad, a width w of each wiring, a clearance c, and a via pad pitch p, and calculates a value of an excess clearance m in accordance with the expression (1).

$$m = p - \min p \qquad (1)$$
$$= p - 2r - (n \times w) - (n+1)c$$

The expression (1) is an arithmetic expression for calculating an excess amount m of a clearance relative to a via pad pitch p predetermined in board design CAD data in a case where n wirings 3 are housed between two via pads 2-1 and 2-2. Here, the number of wirings 3 is two, as an example.

The expression (1) indicates that a minimum clearance c needs to be secured between the via pad 2-1 or 2-2 and the wiring 3 and between the housed wirings 3. Thus, the expression (1) finds the remaining clearance in a case where n wirings 3 are housed between the via pads 2-1 and 2-2 while a clearance c is secured between the via pad and the wiring or between the wirings.

Figure 5:
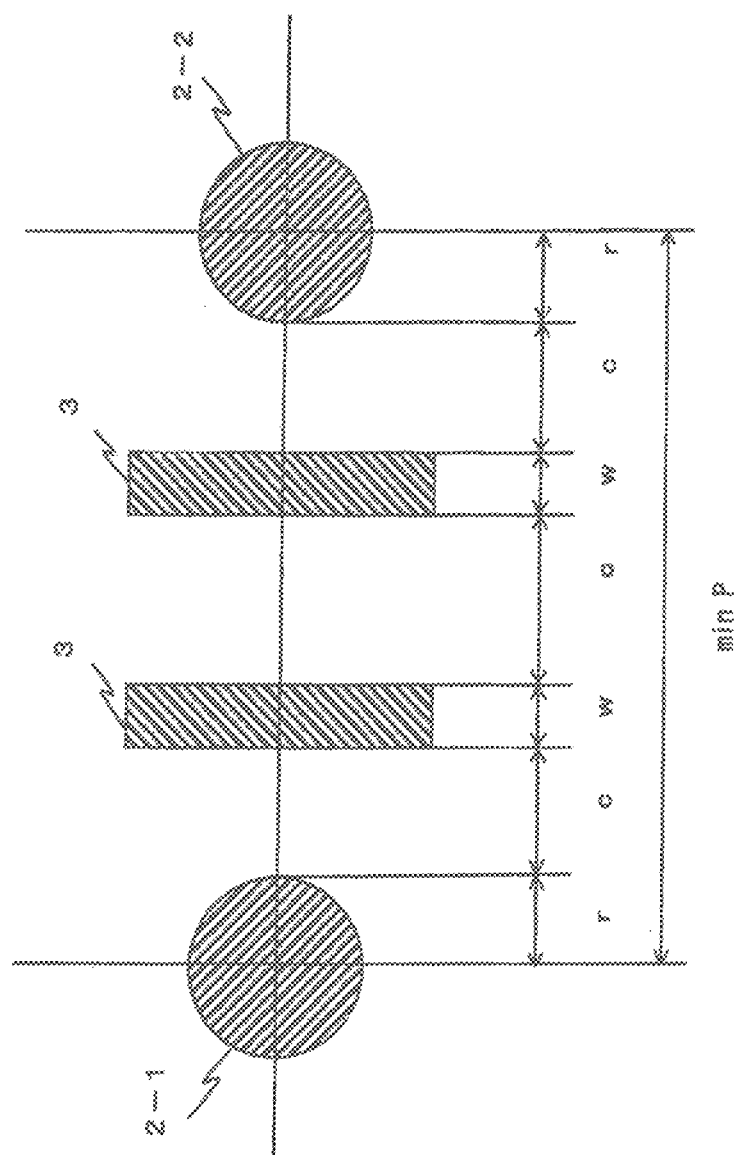
FIG. 5 is an explanatory diagram explaining a via pad minimum pitch interval required for housing wirings according to the embodiment.

As illustrated in FIG. 5, "min p" is a minimum distance of a via pad pitch required for housing n wirings 3 between the two via pads 2-1 and 2-2.

Figure 6:
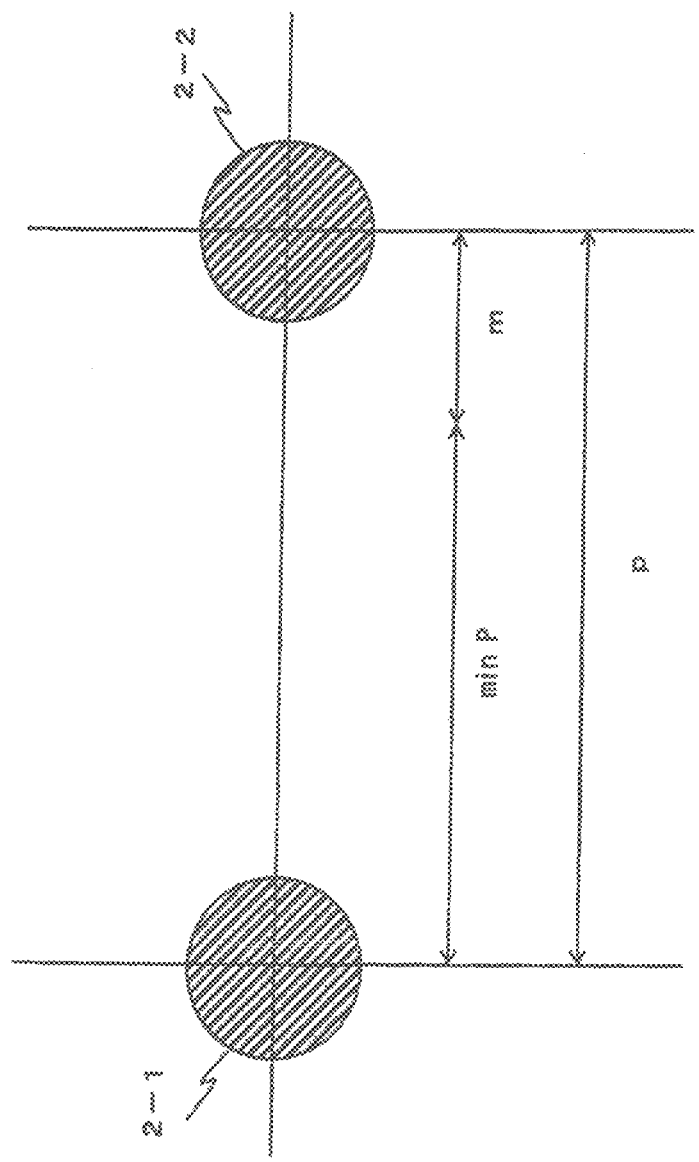
FIG. 6 is an explanatory diagram explaining calculation of an excess clearance according to the embodiment.

In the expression (1), a differential value found by subtracting a minimum via pad pitch min P required for housing n wirings from a predetermined via pad pitch p is a value of an excess clearance m (see FIG. 6).

[Calculation Method of Insufficient Clearance s]

Next, the calculation method of an insufficient clearance a with (n+1) wirings will be described with reference to FIG. 7.

The main control unit 11 increments the number of wirings 3 housed between the via pads 2-1 and 2-1, so that the number of wirings is n+1. Then, the main control unit 11 uses a radius r of each via pad, a width w of each wiring, a clearance c, and a via pad pitch p to calculate a value of an insufficient clearance s in accordance with the expression (2).

$$s = \min p - p$$
$$= 2r + (n+1)w + (n+2) - p \quad (2)$$

The expression (2) is an arithmetic expression for calculating an insufficient amount of a clearance with the via pad pitch p predetermined in board design CAD data in a case where (n+1) wirings are housed. That is, the expression (2) finds an insufficient clearance amount when the number of wirings housed between the two via pads 2-1 and 2-2 is increased.

Figure 7:
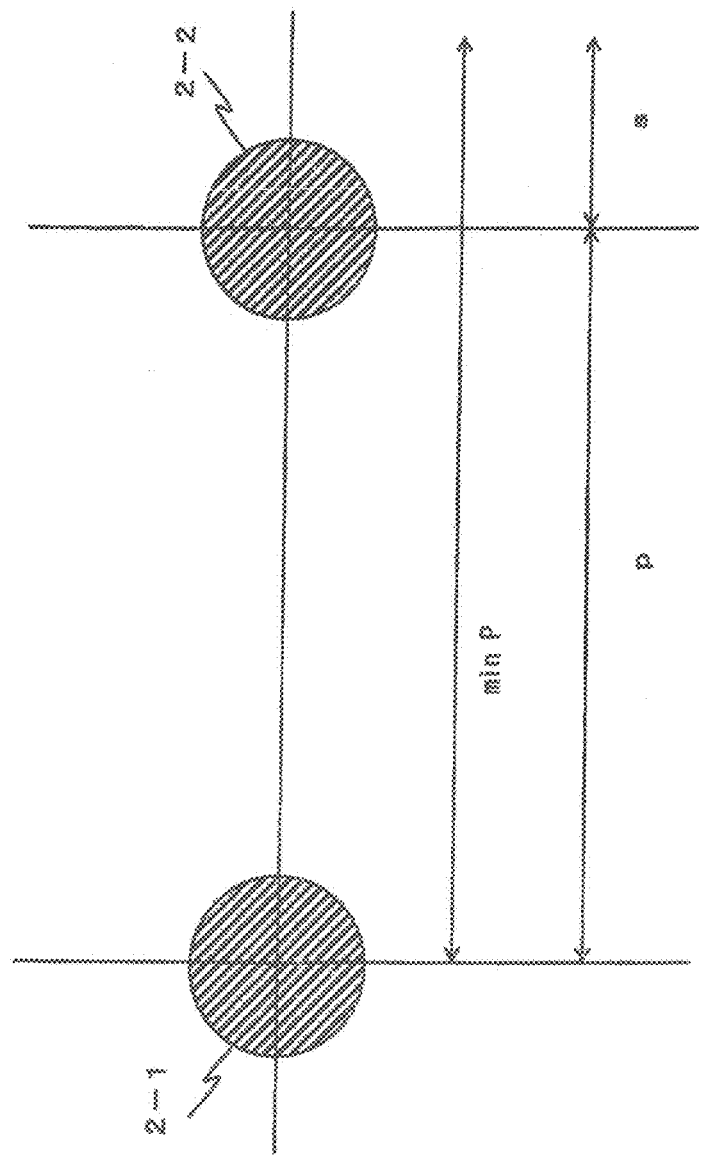
FIG. 7 is an explanatory diagram explaining calculation of an insufficient clearance according to the embodiment.

As illustrated in FIG. 7, in the expression (2), a differential value found by subtracting a predetermined via pad pitch p from a minimum via pad pitch min P required for housing (n+1) wirings is a value of an insufficient clearance s.

[Comparison Between Excess Clearance m and Insufficient Clearance s]

The main control unit 11 compares a value of an excess clearance m and a value of an insufficient clearance s (S13).

Then, when a value of an excess clearance m is equal to or larger than a value of an insufficient clearance s (S13), the main control unit 11 determines that via pads can be arranged with unequal pitches, and shifts the processing to S14. That is, when a value of an excess clearance m is equal to or larger than a value of an insufficient clearance s, the main control unit 11 determines that n wirings 3 can be housed between via pads (that is, the number of housed wirings can be increased) and moves positions of the via pads arranged in a latticed pattern with equal pitches.

On the other hand, when a value of an excess clearance m is smaller than a value of an insufficient clearance s (s13), the main control unit 11 determines that the via pads cannot be arranged with unequal pitches, and performs via pad normal arrangement processing (S16).

[Calculation of Via Moving Amount (Offset Amount) and Arrangement]

When a value of an excess clearance m is equal to or larger than an insufficient clearance a at S13, the main control unit 11 calculates a moving amount delta for moving vias in the X-direction and Y-direction from the position coordinates of via pads arranged in a latticed pattern with equal pitches (S14).

Then, the main control unit 11 adds or subtracts the moving amount delta to or from position coordinates (that is, each of an x-coordinate value and a y-coordinate value) of via pads arranged in a latticed pattern with equal pitches to calculate position coordinates (an x-coordinate value and a y-coordinate value) of the via pads with unequal pitches (S15). Thus, it is possible to arrange, with unequal pitches, via pads arranged in a latticed pattern with equal pitches (S15).

Figure 1:
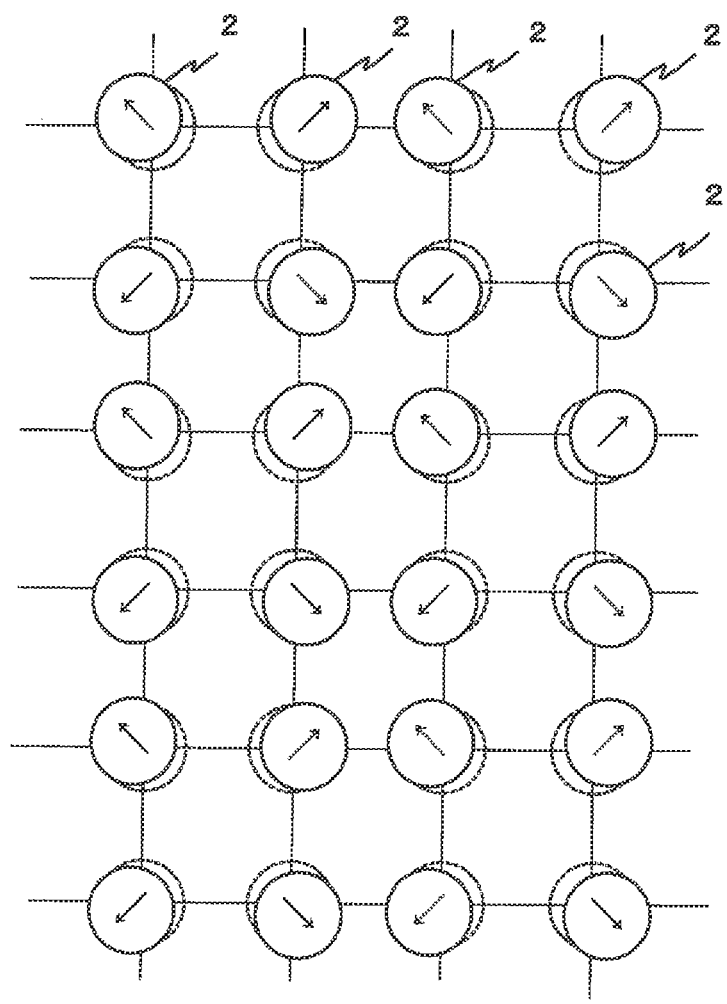
FIG. 1 is an explanatory diagram explaining an arrangement example of via pads arranged with unequal pitches according to an embodiment.
Figure 8:
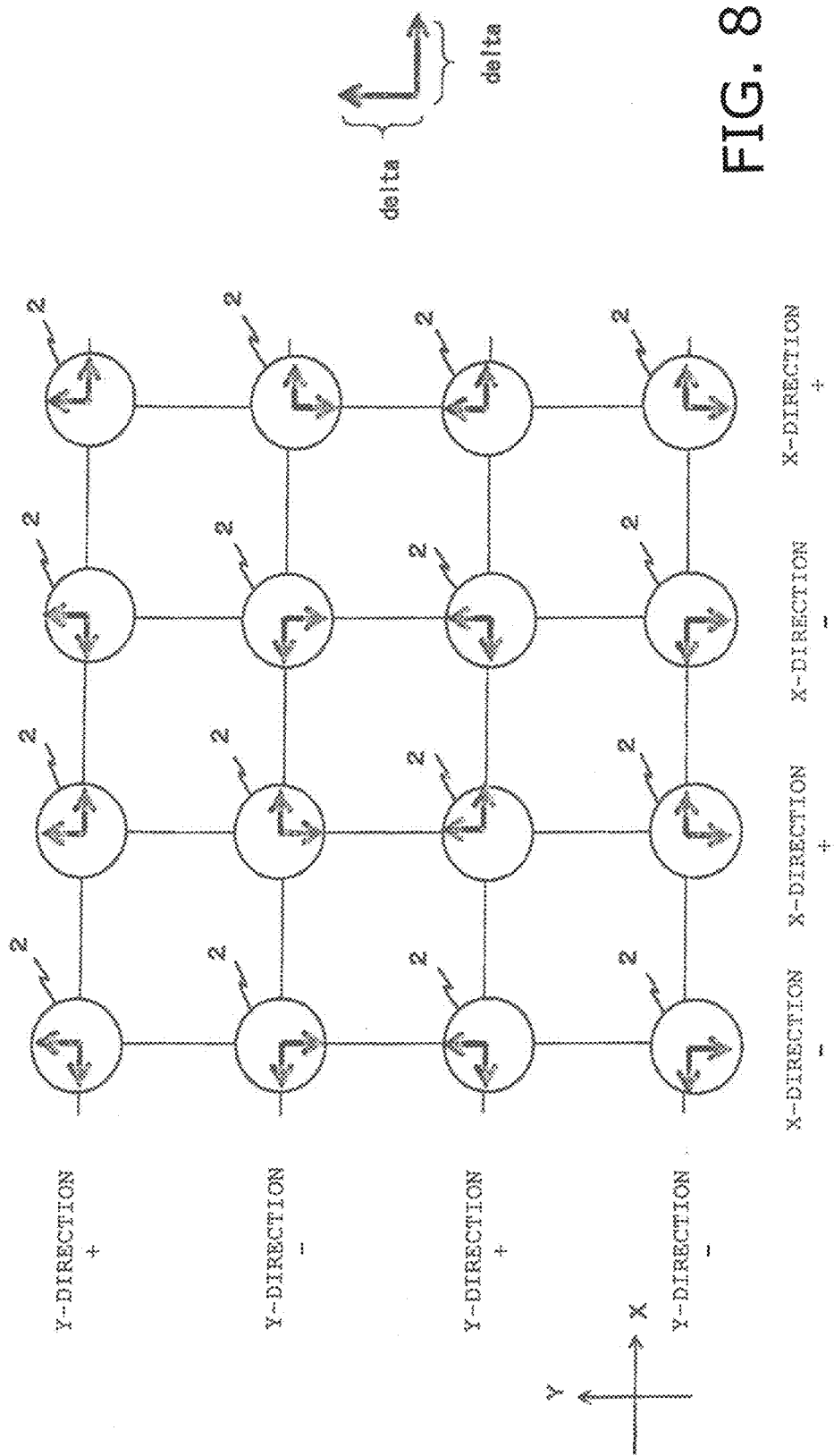
FIG. 8 is an explanatory diagram explaining moving directions of via pads arranged in a latticed pattern with equal pitches according to the embodiment.

Here, the following will describe a method of calculating a via pad moving amount delta and a method of arranging via pads that are performed by the main control unit 11 with reference to FIG. 1 and FIG. 8.

The main control unit 11 uses a value of an excess clearance m and a value of an insufficient clearance a to calculate a moving amount delta of each via pad in accordance with the expression (3).

$$s/2 \leq delta \leq m/2 \quad (3)$$

In the expression (3), a value of a moving amount delta of each via pad is equal to or larger than ½ of a value of an insufficient clearance s, and equal to or smaller than ½ of a value of an excess clearance m. The value of a moving amount delta may be an arbitrary value as long as the conditions of the above-described expression (3) are fulfilled.

As described, the moving amount delta is a moving amount in the X-direction and a moving amount in the Y-direction from position coordinates of each via pad on a lattice point of equal pitch. In the embodiment, the moving amount in the X-direction is assumed to be equal to the moving amount in the Y-direction. That is, each via pad moves in the X-direction by a moving amount delta, and moves in the Y-direction by a moving amount delta. In this manner, the moving amount in the X-direction is equal to the moving amount in the Y-direction, and the position after the movement is a position of a via after the arrangement adjustment.

Moreover, as illustrated in FIG. 8, regarding the moving direction from position coordinates of each via pad on a lattice point of equal pitch, the moving directions of the moving amount delta is alternately changed in both the X-direction and the Y-direction.

In other words, as the moving direction regarding the X-direction, via pads on the same row among via pads arranged in a latticed pattern are moved in the "− direction" by a moving amount delta, and via pads on rows adjacent to the above-described row are moved in the "+ direction" by a moving amount delta. In this manner, the via pads are moved in the X-direction by a moving amount delta from an X-coordinate value while alternately changing the moving direction for each row.

The moving direction regarding the Y-direction is also same as the movement in the X-direction. That is, via pads on the same column among via pads arranged in a latticed pattern are moved in the "− direction" by a moving amount delta, and via pads on columns adjacent to the above-described column are moved in the "+ direction" by a moving amount delta. In this manner, the via pads are moved in the Y-direction by a moving amount delta from a Y-coordinate value while alternately changing the moving direction for each column.

As described above, each via pad is moved by a moving amount delta while alternately changing a moving direction in each of the X-direction and the Y-direction, whereby the via pads 2 arranged in a latticed pattern with equal pitches are arranged with unequal pitches, as illustrated in FIG. 1.

[Setting of Wiring]

Once the via pads 2 are arranged with unequal pitches, the main control unit 11 sets the wiring 3 between the via pads 2.

Here, the description will be made with reference to FIG. 1, FIG. 10, FIG. 11, and FIG. 13 while comparing a case in which the wiring 3 is set between the via pads 2 (2-1 and 2-2) with equal pitches and a case in which the wiring 3 is set between the via pads 2 (2-1 and 2-2) with unequal pitches.

Note that it is supposed that the radius r of the via pads 2 (2-1 and 2-2) is 0.5 mm, the wiring width w is 0.1 mm, and the clearance c of 0.05 mm or larger needs to be secured between the via pad 2 and the wiring 3 or between the wirings.

Figure 13:
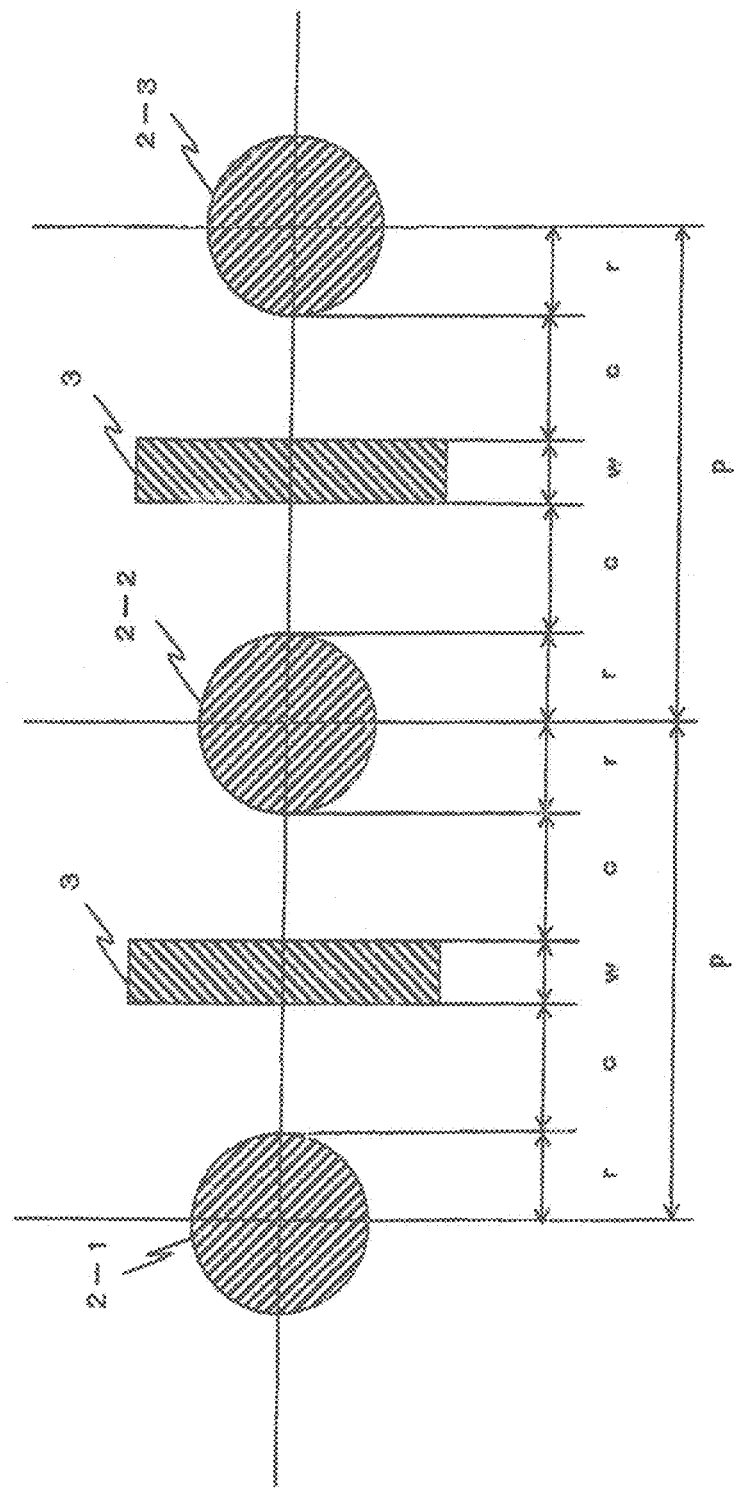
FIG. 13 is an explanatory diagram explaining a conventional arrangement example of wirings arranged between via pads.

As illustrated in FIG. 13, when the via pad pitch interval p of equal pitch is 0.8 mm, only one wiring 3 can be housed between the via pads 2-1 and 2-2.

Meanwhile, it is supposed that the position coordinates of the via pads 2 are moved by a moving amount delta of 0.05 mm, for example, so that the via pads 2 are arranged with unequal pitches, as illustrated in FIG. 1.

Figure 10:
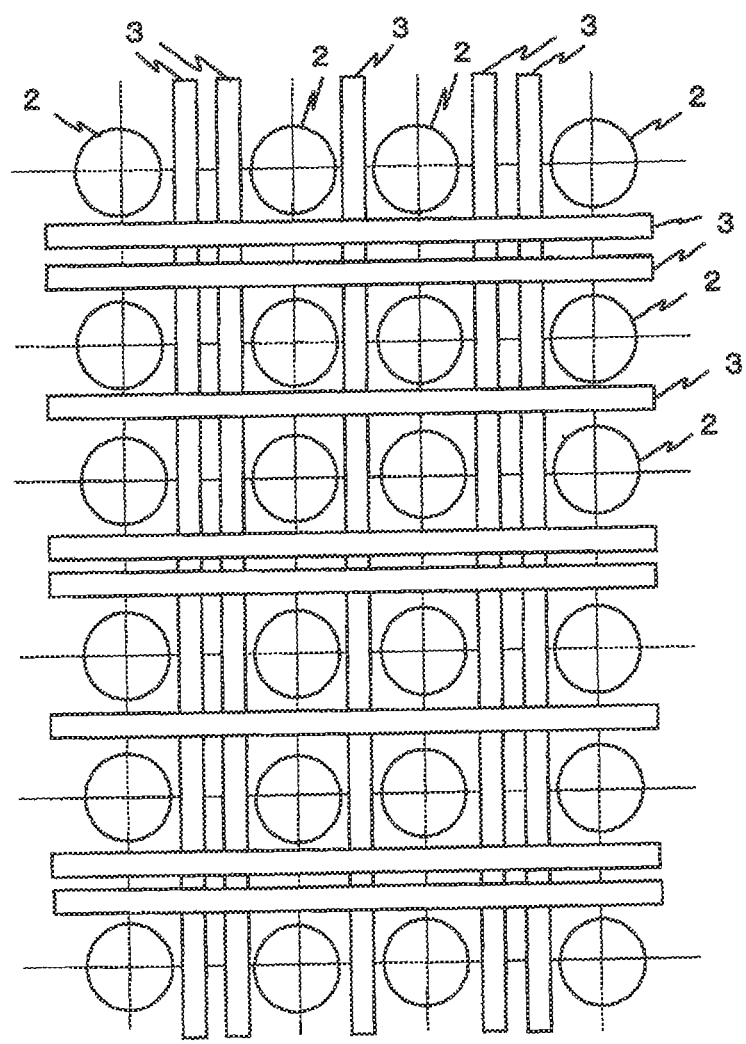
FIG. 10 is an explanatory diagram explaining wiring setting after arrangement of via pads with unequal pitches according to the embodiment.
Figure 11:
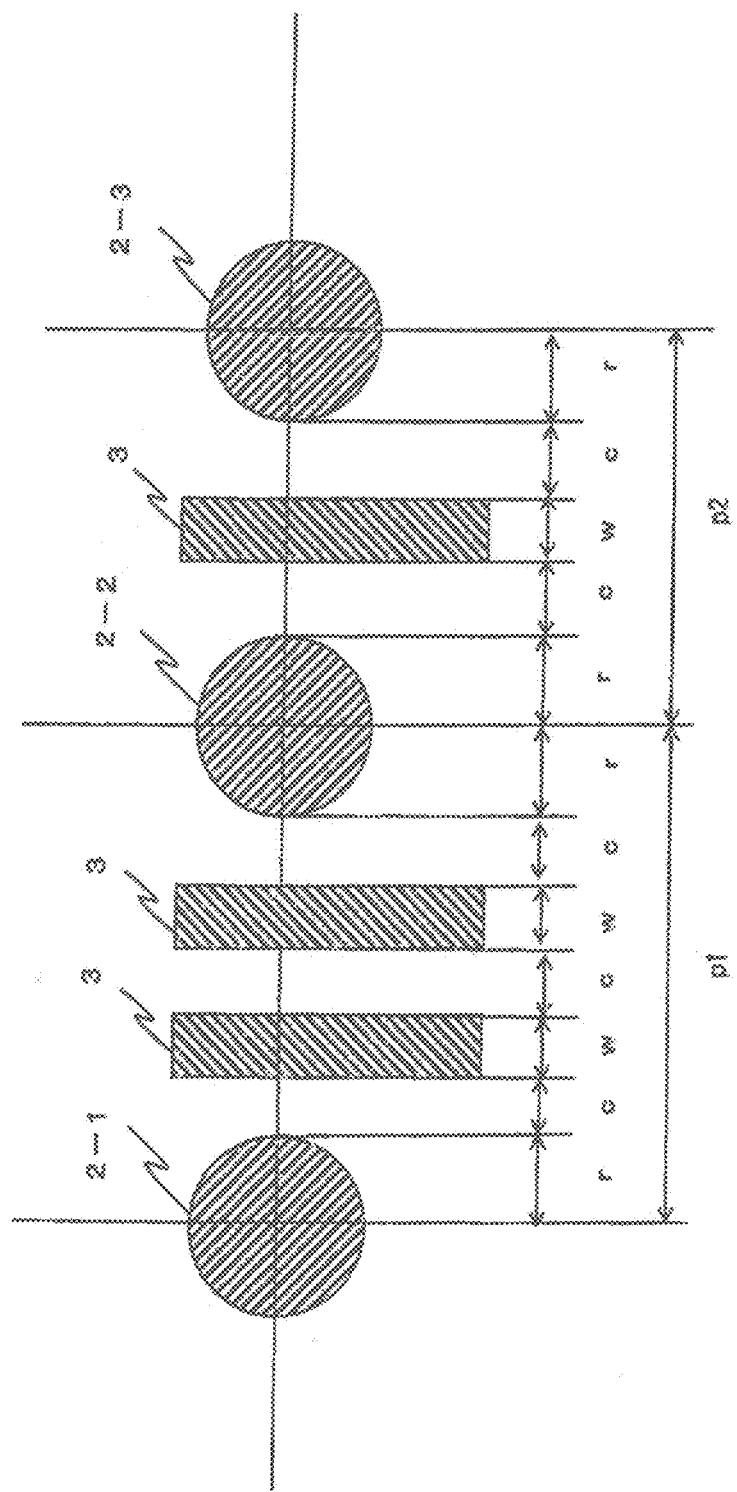
FIG. 11 is an explanatory diagram explaining arrangement of wirings arranged between via pads with unequal pitches according to the embodiment.
Figure 12:
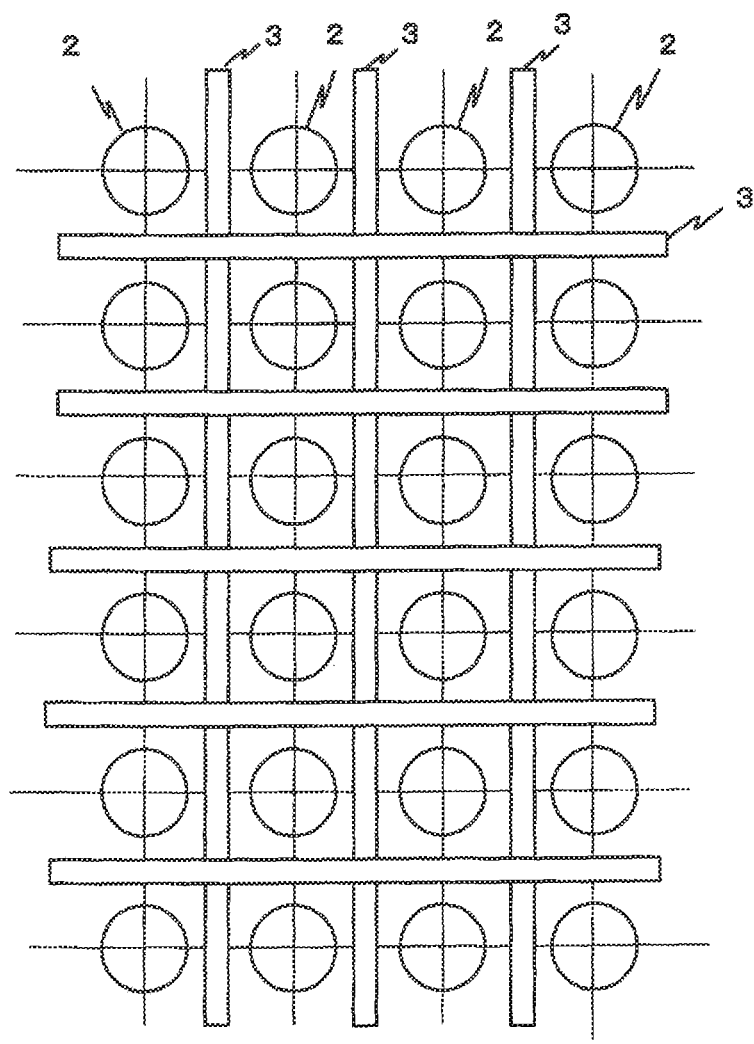
FIG. 12 is an explanatory diagram explaining a conventional arrangement example of via pads arranged in a latticed pattern with equal pitches.

In this case, as illustrated in FIG. 11, a via pad pitch interval p1 between the via pad 2-1 and the via pad 2-2 is 0.9 mm, and thus two wirings 3 can be housed between the via pads 2-1 and 2-2. On the other hand, a via pad pitch interval p2 between the via pad 2-2 and a via pad 2-3 is 0.7 mm, and thus one wiring 3 can be housed between the via pads 2-2 and 2-3 (see FIG. 10).

In this manner, the via pads 2 arranged with unequal pitches causes an area with an increased pitch interval between adjacent via pads 2 and an area with a reduced pitch interval between adjacent via pads 2. Therefore, for the area with an increased pitch interval, the main control unit 11 can increase the number of housed wirings 3, and house wirings 3, as illustrated in FIG. 10 and FIG. 11.

Moreover, a value of the moving amount delta for moving the position of a via is assumed to be equal to or larger than ½ of a value of an insufficient clearance s and equal to or smaller than ½ of a value of an excess clearance m, as in the above-described expression (3). Thus, even in the area with a reduced pitch interval, it is possible to house the same number of wirings 3 as a case in which the via pads 2 are arranged with equal pitches.

(A-3) Effects of Embodiment

As described above, in the embodiment, a moving amount as an offset amount is added or subtracted to or from position coordinates of via pads arranged in a latticed pattern with equal pitches to arrange the via pads with unequal pitches. Thus, it is possible to improve the wiring housing property without deviation in the vertical direction and the horizontal direction, without expanding via arrangement areas.

Moreover, in the embodiment, the via pads are arranged with predetermined regular unequal pitches, which achieves preferable working efficiency.

Furthermore, the embodiment improves the wiring housing property. Thus, it is possible to expect reduction of the number of layers of a multilayer wiring board and reduce manufacturing costs of the wiring board.

(B) Other Embodiments

In the above-described embodiments, various modifications have been described. In addition, the present disclosure can be also adapted to the following modifications.

(B-1) In the above-described embodiment, the via arrangement method has been described as an example. However, the present disclosure can be also adapted to a wiring board including a plurality of electronic parts provided with pitches, such as a ball grid array (BGA), for example, so as to position one or more columns of terminals of the above electronic parts arranged with equal pitches. That is, the embodiment is not limited to the arrangement of vias, and may be the arrangement of terminals of electronic parts. Moreover, as long as they are arranged with equal pitches, the arrangement is not limited to a latticed pattern.

(B-2) In the above-described embodiment, the calculation method of an excess clearance and the calculation method of an insufficient clearance are not limited to the ones described above.

REFERENCE SIGNS LIST 2 (2-1 to 2-3), 21, 22 via pad
3 wiring pattern
10 wiring board design support apparatus
11 main control unit
12 external storage unit
13 display unit
14 input unit
11P program for wiring board via arrangement
111 design data reading unit
112 via arrangement unit
113 wiring setting unit
41 excess clearance calculation unit
42 insufficient clearance calculation unit
43 via moving amount calculation unit
44 via coordinate calculation unit
45 via arrangement information output unit

The invention claimed is:

1. A wiring board design support apparatus arranging a plurality of vias on a wiring board, comprising:
a design information storage unit that stores design information of vias and wirings to be arranged on the wiring board; and
a wiring board via arrangement unit that moves, on a basis of the design information, positions of lattice points arranged with same intervals in both a vertical direction and a horizontal direction by a given moving amount in the vertical direction and the horizontal direction while alternately changing a moving direction in the horizontal direction of the lattice points for each row of the lattice and alternately changing a moving direction in the vertical direction of the lattice points for each column of the lattice, so as to arrange vias at positions of the lattice points after movement,
wherein the wiring board via arrangement unit includes:
an excess clearance calculation unit that calculates a value of an excess clearance when a wiring is arranged between vias that are located at positions of lattice points with equal intervals in the vertical and horizontal directions,
an insufficient clearance calculation unit that calculates a value of an insufficient clearance when a number of wirings arranged between the vias is increased,
a moving amount calculation unit that calculates the given moving amount based on the excess clearance value and the insufficient clearance value, and
wherein the wiring board via arrangement unit alternately moves the lattice points by the given amount in each of the vertical and horizontal directions to:
reduce the excess clearance between the wiring and vias located at positions of lattice points adjacent the wiring, and
provide sufficient clearance between the increased number of wirings and positions of lattice points adjacent the increased number of wirings,
whereby a resulting pitch of the lattice points after said movements is unequal so as to alternately accommodate different numbers of wirings between adjacent vias in the horizontal and vertical directions.

2. The wiring board design support apparatus according to claim 1, wherein the moving amount calculation unit calculates the given moving amount for moving the positions of the lattice points in the vertical direction and the horizontal direction in accordance with a comparison result between the value of the excess clearance and the value of the insufficient clearance.

3. The wiring board design support apparatus according to claim 1, further comprising a wiring setting unit that sets a wiring between the vias in via arrangement made by the wiring board via arrangement unit.

4. A method for wiring board via arrangement for arranging a plurality of vias on a wiring board, comprising:
- storing, by a design information storage unit, design information of vias and wirings to be arranged on the wiring board;
- calculating a value of an excess clearance when a wiring is arranged between vias that are arranged at positions of lattice points with equal intervals in the vertical and horizontal directions,
- calculating a value of an insufficient clearance when a number of wirings arranged between the vias is increased; and
- moving, by a wiring board via arrangement unit, on a basis of the design information, positions of lattice points arranged with same intervals in vertical and horizontal directions by a given moving amount in both a vertical direction and a horizontal direction,
- wherein a moving direction of the lattice points is alternately changed in the horizontal direction of the lattice points for each row of the lattice and alternately changed in the vertical direction of the lattice points for each column of the lattice, so as to:
  - reduce the excess clearance between the wiring and vias arranged at positions of the lattice points adjacent the wiring, and
  - provide sufficient clearance between the increased number of wirings and vias located at positions of the lattice points adjacent the increased number of wirings, and
- whereby a resulting pitch of the lattice points after said movements is unequal so as to alternately accommodate different numbers of wirings between adjacent vias in the horizontal and vertical directions.

5. A recording medium readable by a computer storing a program for wiring board via arrangement, the computer comprising:
- a design information storage unit that stores design information of vias and wirings to be arranged on a wiring board; and
- a wiring board via arrangement unit that moves, on a basis of the design information, positions of lattice points arranged with same intervals in both a vertical direction and a horizontal direction by a given moving amount in the vertical direction and the horizontal direction while alternately changing a moving direction in the horizontal direction of the lattice points for each row of the lattice and alternately changing a moving direction in the vertical direction of the lattice points for each column of the lattice, so as to arrange vias at positions of the lattice points after movement,
- wherein the wiring board via arrangement unit includes:
  - an excess clearance calculation unit that calculates a value of an excess clearance when a wiring is arranged between vias that are located at positions of lattice points with equal intervals in the vertical and horizontal directions,
  - an insufficient clearance calculation unit that calculates a value of an insufficient clearance when a number of wirings arranged between the vias is increased,
  - a moving amount calculation unit that calculates the given moving amount based on the excess clearance value and the insufficient clearance value, and
- wherein the wiring board via arrangement unit alternately moves the lattice points by the given amount in each of the vertical and horizontal directions to:
  - reduce the excess clearance between the wiring and vias located at positions of lattice points adjacent the wiring, and
  - provide sufficient clearance between the increased number of wirings and positions of lattice points adjacent the increased number of wirings,
- whereby a resulting pitch of the lattice points after said movements is unequal so as to alternately accommodate different numbers of wirings between adjacent vias in the horizontal and vertical directions.

6. The wiring board design support apparatus according to claim 5, further comprising a wiring setting unit that sets a wiring between the vias in via arrangement made by the wiring board via arrangement unit.

* * * * *